(12) United States Patent
Sagawa (10) Patent No.: US 6,237,783 B1
(45) Date of Patent: May 29, 2001

(54) APPARATUS FOR STORING CUSTOMER TRAYS

(75) Inventor: Makoto Sagawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/277,529

(22) Filed: Mar. 26, 1999

(30) Foreign Application Priority Data

Mar. 27, 1998 (JP) .................................................. 10-081694

(51) Int. Cl.7 ...................................................... A47F 49/00
(52) U.S. Cl. ...................... 211/49.1; 211/126.7; 211/189; 312/265.1; 248/346.5
(58) Field of Search .................................. 211/49.1, 189, 211/126.7; 312/265.1–265.6, 352, 257.1, 262, 270.2, 293.2; 248/346.5; 220/4.09, 4.33–4.34, 23.4, 4.28

(56) References Cited

U.S. PATENT DOCUMENTS

| | | | | |
|---|---|---|---|---|
| 3,265,419 | * | 8/1966 | Durnbaugh et al. ............... | 312/257.1 |
| 3,347,609 | * | 10/1967 | Mann ................. | 312/257.1 |
| 3,879,096 | * | 4/1975 | Blodee ................. | 312/257.1 |
| 3,966,285 | * | 6/1976 | Porch et al. ......... | 312/257.1 |
| 4,045,104 | * | 8/1977 | Peterson ............. | 312/257.1 |
| 4,643,319 | * | 2/1987 | Debus et al. ........... | 211/189 |
| 4,691,970 | * | 9/1987 | Neri .................. | 312/257.1 |
| 4,777,565 | * | 10/1988 | McIntosh ............ | 312/257.1 |
| 4,786,122 | * | 11/1988 | Nichoalds ........... | 312/257.1 |
| 4,974,386 | * | 12/1990 | Erikkson et al. .......... | 312/257.1 |
| 5,016,765 | * | 5/1991 | Leonardo ............. | 211/189 |
| 5,064,236 | * | 11/1991 | Stanfield ............. | 211/49.1 |
| 5,145,073 | * | 9/1992 | Kitagawa et al. ...... | 211/49.1 |
| 5,372,262 | * | 12/1994 | Benson et al. ........ | 211/189 |
| 5,590,939 | * | 1/1997 | Piontek .............. | 312/257.1 |
| 5,722,514 | * | 3/1998 | Kiyokawa ............ | 187/270 |
| 5,772,387 | * | 6/1998 | Nakamura et al. ..... | 414/416 |
| 6,070,731 | * | 6/2000 | Kobayashi et al. ..... | 220/4.09 |

* cited by examiner

Primary Examiner—Daniel P. Stodola
Assistant Examiner—Jennifer E. Novosad
(74) Attorney, Agent, or Firm—Gallagher & Lathrop; David N. Lathrop (57) ABSTRACT

A customer tray storing apparatus which is capable of storing customer trays in a stocker by moving them in the horizontal direction as well as removing them from the stocker in the horizontal direction. The customer tray storing apparatus comprises a generally rectangular bottom frame for resting thereon customer trays, guide pins attached to the bottom frame adjacent the opposite ends of one of the minor sides of the frame, a pair of door posts attached to the bottom frame adjacent the opposite ends of the other minor side of the bottom frame, a pair of guide rails attached to the bottom frame along the opposed major sides of the bottom frame, and a door pivotally supported by the pair of door posts at their lower ends. The door comprises a generally square or rectangular door member and a pair of reinforcing beams supporting the door member along the opposite lateral side portions thereof. The reinforcing beams are provided at their lower ends with pivot shafts. The door is pivotally supported by the pivot shafts fitted in corresponding bearings provided in the pair of door posts adjacent their lower ends.

17 Claims, 8 Drawing Sheets

APPARATUS FOR STORING CUSTOMER TRAYS

BACKGROUND OF THE INVENTION

1. Field of the Invention

The present invention relates to a customer tray storing apparatus for storing customer trays (known also as universal tray) used in a semiconductor device testing apparatus, and particularly to a customer tray storing apparatus having a pivotally mounted door, the arrangement being such that when the door is opened, it may be rotated or pivoted to a position in which the door is flush with the plane of the bottom surface of the customer tray storing apparatus.

2. Description of the Related Art

In a semiconductor device testing apparatus for testing various types of semiconductor devices, a number of customer trays for accommodating devices to be tested and tested devices are used. Before proceeding to describe the conventional customer tray storing apparatus, the IC testing apparatus for testing a semiconductor integrated circuit (as will be referred to as IC hereinafter) which is typical of semiconductor devices will be briefly described with reference to FIG. 6.

Many of IC testing apparatuses for measuring the electrical characteristics of ICs to be tested (ICs under test) by applying a test signal of a predetermined pattern to the ICs have an IC transporting/handling or processing apparatus (commonly called handler in this art) integrally connected thereto for transporting ICs to be tested to a test or testing section where they are brought into electrical contact with an IC socket mounted on a test head (a part of the IC testing apparatus for supplying and receiving various electrical signals for testing), followed by, after completion of the test, carrying the tested ICs out of the test section and sorting them out into defectless or conforming (pass) and defective or non-conforming (failure) articles on the basis of the test results. In the following disclosure, the present invention will be described by taking the IC testing apparatus having this type of handler connected thereto by way of example for the convenience of explanation.

Figure 6:
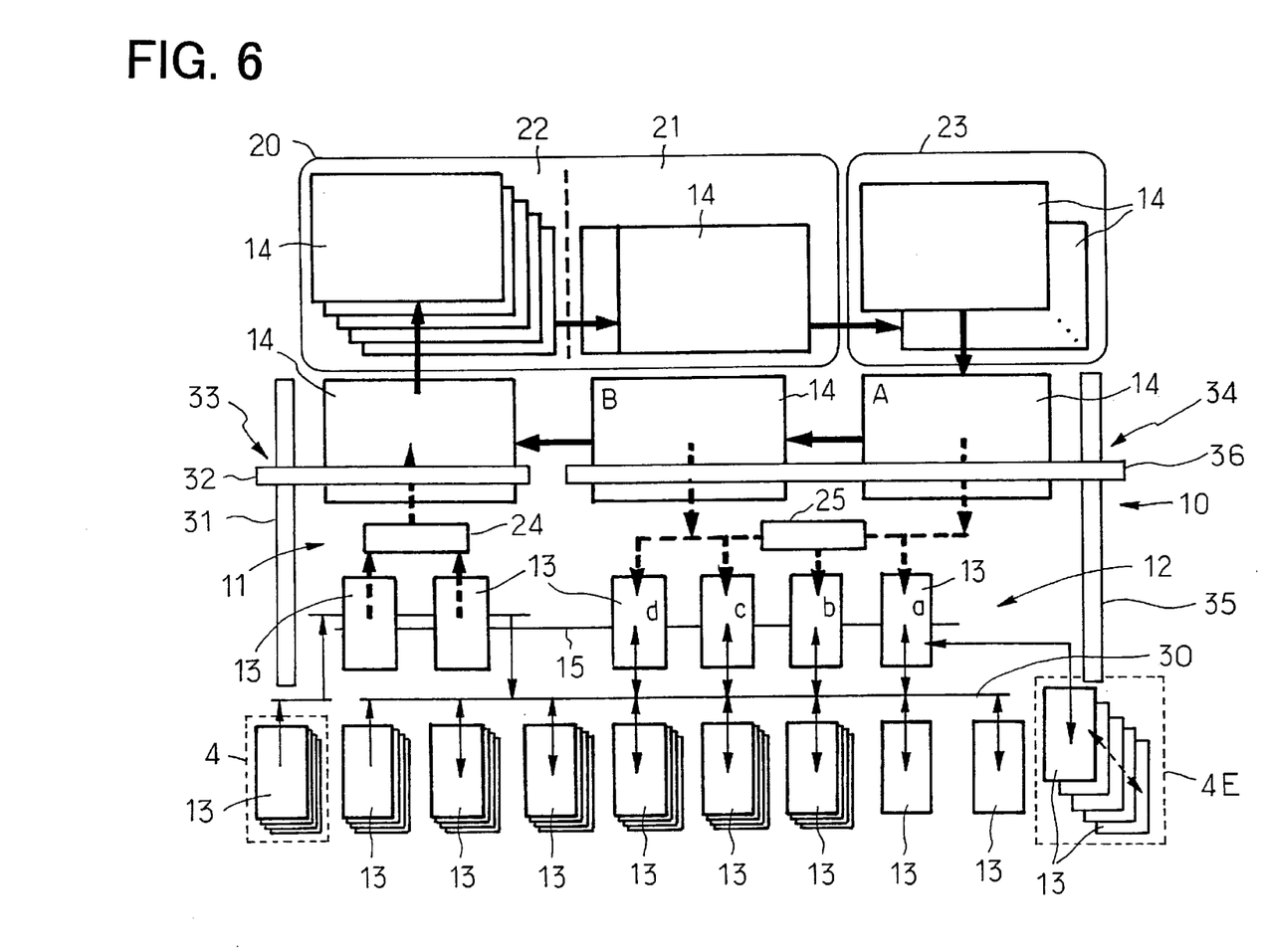
FIG. 6 is a plan view of illustrating the general construction of the handler incorporated in the IC testing apparatus.

FIG. 6 is a plan view illustrating the general construction of the IC transporting/handling apparatus (hereinafter referred to as handler) integrally connected to the IC testing apparatus with a plurality of test trays 14 within a soak chamber 22 and an exit chamber 23 and stacked customer trays 13 shown in a perspective view. In addition to a constant temperature chamber 20 containing the soak chamber 22 and a test section 21 therein, and the exit chamber 23 (also called heat-removal/cold-removal chamber), the illustrated handler includes a loader section 11 where ICs to be tested (ICs under test) are transferred from the customer trays and reloaded onto test trays 14, an unloader section 12 where the tested ICs which have been carried on the test tray 14 out through the exit chamber 23 subsequently to undergoing a test in the test section 21 are transferred from the test tray 14 to the customer tray 13 (also called universal tray) to be reloaded on the latter, customer tray storing apparatuses (called customer tray stocker in this field) 4, 4E for storing customer trays 13 loaded with ICs to be tested (ICs under test), customer trays 13 loaded with ICs already tested and sorted, and empty customer trays loaded with no ICs.

The soak chamber 22 of the constant temperature chamber 20 is designed for imposing a temperature stress of either a predetermined high or low temperature on ICs under test loaded on a test tray 14 in the loader section 11 while the test section 21 of the constant temperature chamber 20 is designed for executing electrical tests on the ICs under the predetermined temperature stress imposed in the soak chamber 22. In order to maintain the ICs applied in the soak chamber with a temperature stress of either a predetermined high or low temperature in that temperature during the test, the soak chamber 22 and the test section 21 are both contained in the constant temperature chamber 20 capable of maintaining the interior atmosphere at a predetermined constant temperature.

The illustrated handler is configured such that the soak chamber 22 and the test section 21 of the constant temperature chamber 20 and the exit chamber 23 are arranged in the order named from left to right as viewed in the drawing (referred to as X-axis direction herein) while the loader section 11 and the unloader section 12 are located in front of the constant temperature chamber 20 and the exit chamber 23 (downward in the upward-downward direction as viewed in the drawing (referred to as Y-axis direction herein) which is perpendicular to the X-axis direction). As is apparent from FIG. 6, the loader section 11 is located in front of the soak chamber 22 of the constant temperature chamber 20 while the unloader section 12 is located in front of the test section 21 and the exit chamber 23.

The test tray 14 is moved in a circulating manner from and back to the loader section 11 sequentially through the soak chamber 22 and the test section 21 in the constant temperature chamber 20, the exit chamber 23, and the unloader section 12. In this path of circulating travel, there are disposed a predetermined number of test trays 14 which are successively moved in the directions as indicated by thick solid arrows in FIG. 6 by a test tray transport means, not shown.

A test tray 14 having ICs to be tested loaded thereon from a customer tray 13 in the loader section 11 is conveyed from the loader section 11 to the constant temperature chamber 20, and then delivered to the soak chamber 22 through an inlet port formed in the front wall of the constant temperature chamber 20. The soak chamber 22 is equipped with a vertical transport mechanism which is configured to support a plurality of (say, five) test trays 14 in the form of a stack with a predetermined spacing between stacked two succeeding test trays. In the illustrated example, a test tray newly received from the loader section 11 is supported at the top of the stack while the lowermost test tray is delivered to the test section 21 which on the right-hand side in the X-axis direction, adjoins and communicates with the lower portion of the soak chamber 22. It is thus to be appreciated that test trays 14 are delivered out in the direction perpendicular to that in which they have been introduced.

ICs to be tested are loaded with either a predetermined high or low temperature stress as the associated test tray 14 is moved sequentially from the top to the bottom of the stack by vertically (which is referred to as Z-axis direction) downward movement of the vertical transport mechanism and during a waiting period until the test section 21 is emptied. In the test section 21 there is located a test head, not shown. The test tray 14 which has been carried one by one out of the soak chamber 22 is placed onto the test head where a predetermined number of ICs out of the ICs to be tested loaded on the test tray are brought, as loaded on the test tray, into electrical contact with IC sockets (not shown) mounted on the test head. Upon completion of the test on all of the ICs placed on one test tray through the test head, the test tray 14 is conveyed to the right side in the X-axis direction to the exit chamber 23 where the tested ICs are relieved of heat or cold.

Like the soak chamber 22 as described above, the exit chamber 23 is also equipped with a vertical transport mechanism adapted to support a plurality of (say, five) test trays 14 stacked one on another with a predetermined spacing between stacked two succeeding test trays. In the illustrated example, a test tray newly received from the test section 21 is supported at the bottom of the stack while the uppermost test tray is discharged to the unloader section 12. The tested ICs are relieved of heat or cold to be restored to the outside temperature (room temperature) as the associated test tray 14 is moved sequentially from the bottom to the top of the stack by vertically upward movement of the vertical transport mechanism.

Since the IC test is typically conducted on ICs having a desired temperature stress in a wide range of temperatures such as from −55° C. to +125° C. imposed thereon in the soak chamber 22, the exit chamber 23 cools the ICs with forced air down to the room temperature if the ICs have had a high temperature of, say, about 120° C. applied thereto in the soak chamber 22. if ICs have had a low temperature of, say, about −30° C. applied thereto in the soak chamber 22, the exit chamber 23 heats them with heated air or a heater up to a temperature at which no condensation occurs. For test trays it is usual to use test trays formed of material capable of withstanding such a wide range of temperatures, that is, high/low temperatures. For the application where ICs are tested at the room temperature, however, the test tray 14 need not be formed of material capable of withstanding high/low temperatures.

After the heat removal or cold removal process, the test tray 14 is conveyed from the exit chamber 23 to the unloader section 12 in the direction (facing on the front of the exit chamber 23) perpendicular to that in which it has been introduced from the test section 21 prior to being discharged.

The unloader section 12 is configured to sort out tested ICs by categories based on the data of the test results and load them on the corresponding customer trays 13. In this example, the unloader section 12 provides for stopping the test tray 14 at two positions A and B. The ICs on the test trays 14 stopped at the first position A and the second position B are sorted out based on the data of the test results and transferred onto and stored in the customer trays 13 of the corresponding categories at rest at the customer tray set positions (stop positions) 15, in four customer trays "a" through "d" in the example illustrated.

The test tray 14 emptied in the unloader section 12 is delivered back to the loader section 11 where ICs to be tested are again transferred thereto from the customer tray 13 and loaded thereon to repeat the same steps of operation.

In this example, as shown diagrammatically in FIG. 6, the IC transport assembly for transferring ICs from the customer tray 13 to the test tray 14 in the loader section 11 is in the form of X-Y transport assembly 33 comprising two parallel fixed rails 31 (only the left end one of which is shown) installed over the loader section 11 at the left and right ends thereof respectively and extending in the Y-axis direction (upward-to-downward direction as viewed in the drawing), a movable X-axis arm 32 extending in the X-axis direction (left-to-right direction as viewed in the drawing) which spans between the two rails 31 and is supported at opposite ends thereof by the two rails 31 for movement in the Y-axis direction, and a movable head, not shown (which is known in the art concerned as pick-and-place head) supported by the X-axis arm 32 for movement in the direction that the movable X-axis arm 32 extends, namely, in the X-axis direction. With this construction, the movable head is reciprocally movable in the Y-axis direction between the test tray 14 and the customer tray 13 as well as in the X-axis direction along the movable X-axis arm 32.

The movable head has an IC pick-up pad (IC grasping member) vertically movably mounted on its bottom surface. The movement of the movable head in the X- and Y-axis directions and the downward movement of the pick-up pad bring the pick-up pad into abutment with the ICs placed on the customer tray 13 at rest at the customer tray set position 15 to attract and grasp them by vacuum suction for transfer from the customer tray 13 to the test tray 14. The movable head may be provided with a plurality of, say, eight pick-up pads so that eight ICs at a time may be transferred from the customer tray 13 to the test tray 14.

It is to be noted that a position corrector 24 called "preciser" for correcting the orientation or position of an IC is located between the customer tray set position 15 and the stop position for the test tray 14. The IC position corrector or preciser 24 includes relatively deep recesses into which ICs as being attracted against the pick-up pads are released to fall down prior to being transferred to the test tray 14. The recesses are each bounded by vertical tapered side walls which prescribe for the depth to which the ICs drop into the recesses by virtue of the tapering. Once eight ICs have been positioned relative to each other by the position corrector 24, those accurately positioned ICs are again attracted against the pick-up pads and transferred to the test tray 14. The reason for providing the position corrector 24 is as follows. The customer tray 13 is provided with recesses for holding ICs which are oversized as compared to the size of ICs, resulting in wide variations in positions of ICs stored in the customer tray 13. Consequently, if the ICs as such were grasped by the pick-up pads and transferred directly to the test tray 14, there might be some of them which could not be successfully deposited into the IC storage recesses in the test tray 14. For this reason, the position corrector 24 is disposed which acts to match the accuracy in the array of ICs to that in the array of the IC storage recesses formed in the test tray 14.

The unloader section 12 is equipped with an X-Y transport assembly 34 which is identical in construction to the X-Y transport assembly 33 provided for the loader section 11. The X-Y transport assembly 34 is mounted spanning the first position A and the second position B and performs to transship the tested ICs from the test tray 14 delivered out to the unloader section 12 onto the corresponding customer tray 13. The X-Y transport assembly 34 comprises two parallel fixed rails 35 (only the right end one of which is shown) installed over the unloader section 12 at the ends thereof and extending in the Y-axis direction, a movable X-axis arm 36 extending in the X-axis direction which spans between the two rails 35 and is supported at opposite ends thereof by the two rails 35 for movement in the Y-axis direction, and a movable head (pick-and-place head), not shown, mounted on the movable X-axis arm 36 for movement in the direction that the movable X-axis arm 36 extends, namely, in the X-axis direction.

The sorting operation in the unloader section 12 will now be described. In the IC testing apparatus shown in FIG. 6, the operation of sorting and transshipping tested ICs is performed with respect to only customer trays arranged adjacent to each of the stop positions. Specifically, arranged at the first position A are two right-hand customer trays "a" and "b". Let it be assumed that classification categories 1 and 2 are assigned to the customer trays "a" and "b", respectively. While the test tray 14 is at rest at the first position A, only the tested ICs belonging to the categories 1 and 2 are picked up from the test tray and transferred onto the corresponding customer trays "a" and "b", respectively. Once the test tray 14 at rest at the first position A has been depleted of the ICs belonging to the categories 1 and 2, the test tray is moved to the second position B.

Arranged adjacent to the second position B are two left-hand customer trays "c" and "d". Assuming that classification categories 3 and 4 are allotted to these customer trays "c" and "d", respectively, the tested ICs belonging to the categories 3 and 4 are picked up from the test tray 14 held at the second position B, and transferred onto the corresponding customer trays "c" and "d", respectively. While the sorting is being carried out at the second position B, the next test tray 14 is delivered from the exit chamber 23 to the unloader section 12 and is stopped at the first position A in preparation for the sorting operation.

With the arrangement described above in which the X-Y transport assembly 34 is shared by the two unloader sections (represented by the first and second positions A and B) and in which the sorting operations are limited to the customer trays "a", "b" and customer trays "c", "d" closest to the test tray stop positions A and B, respectively, the distance for the X-Y transport assembly 34 required to travel for the sorting operation can be reduced. It is thus to be understood that this construction permits the overall processing time required for the sorting to be shortened, despite the fact that the single X-Y transport assembly 34 is used for the sorting operation.

It should be noted here that the number of customer trays 13 that can be installed at the customer tray set positions 15 in the unloader section 12 is limited to four in this example by the space available. Hence, the number of categories into which ICs can be sorted in real time operation is limited to four categories 1 to 4 as noted above. While four categories would generally be sufficient to cover three categories for sub classifying "conforming articles" into high, medium and low response speed elements in addition to one category allotted to "non-conforming article," in some instances there may be some among the tested ICs which do not belong to any of these categories. Should there be found any tested ICs which should be classified into a category other than the four categories, a customer tray 13 assigned to the additional category should be taken from the customer tray storing apparatus 4E (which will be referred to as customer tray stocker) which is positioned in the right-hand lower corner as viewed in the drawing and be transported into the unloader section 12 to store the ICs of the additional category. In doing that, it would be needed to transport any one of the customer trays positioned in the unloader section 12 to a predetermined customer tray storing apparatus (which will be referred to as customer tray stocker) for storage therein.

If the replacement of the customer trays is effected in the course of the sorting operation, the latter operation would have to be interrupted during the replacement. For this reason, in this example a buffer section 25 is disposed between the stop positions A and B for the test tray 14 and the locations of the customer trays "a"–"d". The buffer section 25 is configured to temporarily keep tested ICs belonging to a category of rare occurrence.

The buffer section 25 may have a capacity of accommodating, say about twenty to thirty ICs and be equipped with a memory portion for storing the category of ICs placed in IC pockets of the buffer section 25. The locations and category of the individual ICs temporarily kept in the buffer section 25 are thus stored in the memory portion. Between the sorting operations or upon the buffer section 25 being filled with ICs, a customer tray for the category to which the ICs kept in the buffer section belong is carried from the customer tray stocker 4E to the unloader section 12 to receive the ICs. It should be noted that ICs temporarily kept in the buffer section 25 may be scattered over a plurality of categories. In that case, it would be required to transport as many customer trays as the number of categories at a time from the customer tray stocker 4E to the unloader section 12.

The illustrated handler includes one IC-to-be-tested customer tray stocker 4 (the lowest left end stocker as viewed in the drawing) for accommodating customer trays 13 loaded with ICs to be tested, a plurality of tested-IC customer tray stockers for accommodating customer trays 13 loaded with ICs tested and sorted out by categories on the basis of the test results, and at least one stocker for accommodating emptied customer trays. While FIG. 6 shows only the customer trays but no stockers except the stockers 4, 4E at the opposite extreme ends, it is to be understood that all of these customer trays are actually stored in stockers. All of the customer tray stockers described above are configured to accommodate customer trays in the form of a stack. It is to be noted that two of the IC-to-be-tested customer tray stocker 4 may be disposed.

The transport of the customer trays described above is effected by a transfer arm (tray transport) 30. Although not shown in FIG. 6, the transfer arm 30 is adapted to be movable over the entire length of the arrangement of stockers (in the X-axis direction), so that the transfer arm 30 may be moved also to a position over the stocker 4E in which empty customer trays are stored in the form of a stack to transport the uppermost empty customer tray from the top of the stack to the customer tray set position in the unloader section 12.

The transfer arm 30 is provided on its undersurface with grasp means for grasping a customer tray. By way of example, the transfer arm 30 is moved to a position overlying the IC-to-be-tested customer tray stocker 4. In that condition, an elevator (not shown) is actuated to lift the customer trays stacked in the stocker, so that the uppermost customer tray as moved up is engaged and grasped by the grasp means of the transfer arm 30. Once the uppermost customer tray 13 loaded with ICs being tested has been transferred to the transfer arm 30, the elevator is lowered to its original position. The transfer arm 30 is then horizontally moved to and stopped at a position underlying the customer tray set position 15 in the loader section 11 where the transfer arm 30 has its grasp means release the customer tray to allow it to drop into an immediately underlying tray receiver (not shown). The transfer arm 30 having the customer tray unloaded therefrom onto the tray receiver is moved out of the loader section 11. In this condition, the elevator (not shown) is moved upward from below the tray receiver having the customer tray placed thereon to lift up the tray receiver and hence the customer tray loaded with ICs to be tested so that the customer tray is held at the customer tray set position 15.

In the unloader section 12 as well, like the loader section 11, four empty customer trays are positioned and held at the respective customer tray set positions 15 by the transfer arm 30, the tray receivers and associated elevators as described above. Once one customer tray has been fully filled, the customer tray is lowered from the tray set position 15 by the elevator, and is subsequently stored in the customer tray stocker belonging to the category assigned to that particular tray by the transfer arm 30.

Figure 7:
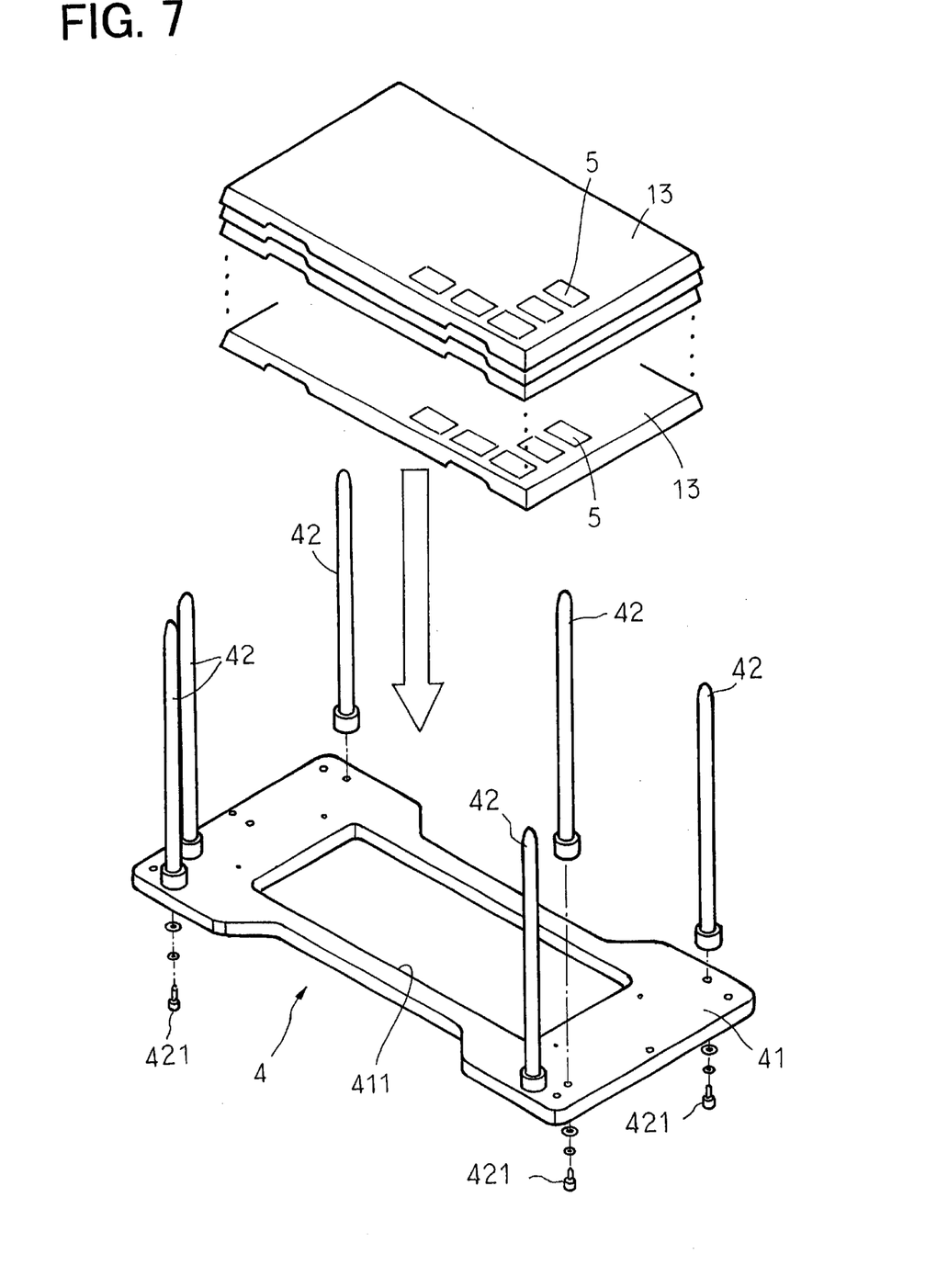
FIG. 7 is an exploded perspective view illustrating one example of the conventional customer tray storing apparatus for use with an IC testing apparatus.

A specific example of the conventional customer tray stocker will now be described with reference to FIG. 7. Since all of the stockers are of the same structure, FIG. 7 representatively shows an IC-to-be-tested customer tray stocker 4. As shown, the customer tray stocker 4 comprises a bottom frame or tray supporting frame 41 generally rectangular in plan view and having a rectangular opening 411 in the center thereof for passage of an elevator therethrough. Guide pins 42 are firmly secured to the bottom frame 41 at its four corners and extend upwardly therefrom perpendicularly to the plane of bottom frame. In the illustrated example, each of the guide pins 42 is firmly secured to the bottom frame 41 by passing a bolt 421 through a through-aperture in the bottom frame 41 from therebelow into threaded engagement with axial screw threads formed in the bottom end of the guide pin.

Two guide pins 42 are disposed along each major side of the bottom frame 41 one adjacent each of the opposite ends of the major side while one guide pin 42 is disposed along each minor side of the bottom frame adjacent only one of the opposite ends with the two guide pins at the minor sides longitudinally opposing each other. It is thus seen that no guide pins are attached to the minor sides adjacent the other ends of the minor sides longitudinally opposing each other. In the illustrated example, one guide pin 42 is disposed adjacent one end of each minor side toward the opposite ends of the left-hand major side as viewed in the drawing.

The points of attachment of and the spacings between the guide pins 42 attached adjacent the opposite ends of one of the major sides of the bottom frame 41 and the associated adjacent guide pins 42 on the minor side are determined such that the corners of a customer tray 13 on one of its major sides may enter into the gaps between the associated paired guide pins 42. It is also to be noted that the guide pins along the opposite major sides are located at opposed positions. When a customer tray 13 is stored in the stocker of the construction described above, the corners of the customer tray 13 on one of its major sides will enter into the gaps between the respective paired guide pins 42 whereby the customer tray 13 may be allowed to move only toward the other major side of the bottom frame 41 with respect to the movement in the horizontal direction. However, since there is one guide pin adjacent each of the opposite ends of the other major side of the bottom frame 41, the movement of the customer tray 13 toward the other major side of the bottom frame 41 is also prohibited. It is thus to be appreciated that the customer tray 13 is stored in a stable state in which it is not allowed to move in any direction as far as the movement in the horizontal plane is concerned.

It is to be noted here that cut-outs formed in the middle of the opposite major sides of the bottom frame 41 are to receive operator's hands (fingers) to thereby improve easiness to manipulate when storing customer trays 13 into the stocker or lifting customer trays therefrom.

The customer tray 13 contains a number of ICs 5 arrayed in a matrix. As shown in FIG. 7, a predetermined number of customer trays 13 each loaded with ICs are stored in the IC-to-be-tested customer tray stocker 4 usually in the form of a stack.

When storing a plurality of customer trays 13 in a stack into the stocker, the operator holds and lowers the stack by grasping the lowermost customer tray while guiding the stack along the guide pins 42 upstanding from the four corners of the bottom frame 41. In doing that, although there would be no special difficulty involved if the operator grasps and lowers the customer trays each loaded with ICs one by one into the stocker, it would disadvantageously require a longer time and lower the operating efficiency. For this reason, it is a usual practice to stack a predetermined number of customer trays to be stored one on another and for the operator to hold and lower the stack into the stocker by grasping the lowermost customer tray by hand while guiding the stack along the guide pins 42 from above the stocker.

However, since a plurality of customer trays each loaded with ICs weighs in total as much as 3 to 5 Kg, it is a considerably heavy work for the operator to carry out the storing job. Neither is it always an easy work to grasp a heavy stack of customer trays by hand and guide it along the guide pins 42 from above the stocker 4. In addition, as the stack of customer trays is lowered into the stocker while being in sliding contact with the guide pins 42, there may occur some shock due to frictional interference between the pins 42 and the customer trays, resulting in an accident that some of the ICs placed in the uppermost customer tray may jump up and become misaligned.

Furthermore, since the conventional customer tray stocker is configured to receive customer trays from above, it had the problem in that it was unable to meet the needs of the user for the front loading system of storing customer trays into the handler (the system of transporting customer trays horizontally into the handler from its front and storing them in a stocker).

When a predetermined number of customer trays loaded with no ICs are to be stored in the form of a stack into an empty customer tray stocker 4E as well, there are again the aforesaid problems involved except the problem that some of the ICs loaded on the tray may become misaligned, the total weight of the stack of trays loaded even with no ICs is close to that of the stack of trays loaded with ICs. Likewise in the case of the stocker for accommodating customer trays sorted out in the unloader section 12, it would be very desirable in terms of the operating efficiency, the labor required, etc. if it is possible to transport the stack of customer trays horizontally forwardly toward the front of the handler to take it out of the stocker.

SUMMARY OF THE INVENTION

It is an object of the present invention to provide a tray storing apparatus equipped with a pivotable door for use with an IC testing apparatus, which is capable of facilitating the operation of storing and removing customer trays and yet preventing misalignment of ICs loaded on the trays.

It is another object of the present invention to provide a tray storing apparatus which allows for storing customer trays therein by moving them in the horizontal direction as well as taking out them therefrom by moving them in the horizontal direction.

It is yet another object of the present invention to provide a tray storing apparatus which allows for storing customer trays in the form of a stack therein by horizontally transporting the stacked customer trays into the handler from its front as well as taking out customer trays in the form of a stack therefrom by horizontally transporting the stacked customer trays out of the handler to its front.

In order to accomplish the aforesaid objects, the present invention provides a customer tray storing apparatus comprising: a frame for resting thereon customer trays; guide pins attached to the frame adjacent the opposite ends of one of first opposed sides of the frame; a pair of door supports attached to the frame one adjacent each of the opposite ends of the other of the first opposed sides of the frame; a pair of guide members attached to the frame one along each of the second opposed sides of the frame; and a door pivotally supported by the pair of door supports at their lower ends.

In one preferred embodiment, the door comprises a generally square or rectangular door member and a pair of tetrahedral prism-like reinforcing beams supporting the door member along the opposite lateral side portions thereof, the reinforcing beams being provided at their lower ends with engagement portions pivotally engaged with corresponding engagement portions provided on the pair of door supports adjacent their lower ends.

The engagement portions provided on the reinforcing beams at their lower ends may be pivot shafts, and the engagement portions provided on the pair of door supports adjacent their lower ends may be bearings for pivotally supporting the corresponding pivot shafts. Conversely, the reinforcing beams may be provided at their lower ends with bearings while the pair of door supports may be provided adjacent their lower ends with pivot shafts pivotally supported in the corresponding bearings.

Three guide pins in total are attached to the frame so as to extend vertically from the frame, one of the guide pins being positioned adjacent one of the opposite ends of one of the first opposed sides of the frame, and the remaining two of the guide pins being positioned adjacent one ends of the second opposed sides respectively, the one ends of the second opposed sides adjoining the one of the first opposed sides.

The pair of door supports are tetrahedral prism-like members, each of the door supports having a generally L-shaped guide and support portion formed integrally therewith at its lower end, the guide and support portion comprising a first protrusion projecting inwardly from the inner side surface of the corresponding door support and a second protrusion projecting forwardly from the front side surface of the corresponding door support, the top surfaces of the first and second protrusions being flush with each other.

The first protrusion projecting inwardly from the inner side surface of each of the door supports has approximately the same width as that of the inner side surface of the corresponding door support, and the second protrusion projecting forwardly from the front side surface of each of the door supports has a width wider than that of the front side surface of the corresponding door support by the extent of projection inward beyond the front side surface of the door support. The first protrusion projecting inwardly from the inner side surface of each of the door supports is formed in its inner side surface with a cylindrical bearing in which the corresponding one of the pivot shafts provided on the pair of reinforcing beams at their lower ends is pivotally fitted.

Each of the pair of guide members is a rail in the form of an elongated plate-like member, the rail having a guide portion defined by folding inwardly at about a right angle a predetermined length of the lower middle portion of the elongated plate-like member intermediate the opposite ends thereof.

A cushioning stop formed of resilient material is fixed to the side surface of each of the reinforcing beams adjacent the top end thereof, and cushioning stop means formed of resilient material is attached to the front face of the door member adjacent the lower end thereof. A hook is attached to the outer side surface of each of the pair of door supports adjacent its upper end, and a catch member engageable with the hook is attached to the outer side surface of each of the pair of reinforcing beams adjacent it upper end. A handle is attached to the front face of the door member adjacent the upper end thereof.

DETAILED DESCRIPTION OF THE PREFERRED EMBODIMENTS

Now, an embodiment of the present invention will be described in details with reference to FIGS. 1 to 5.

Figure 1:
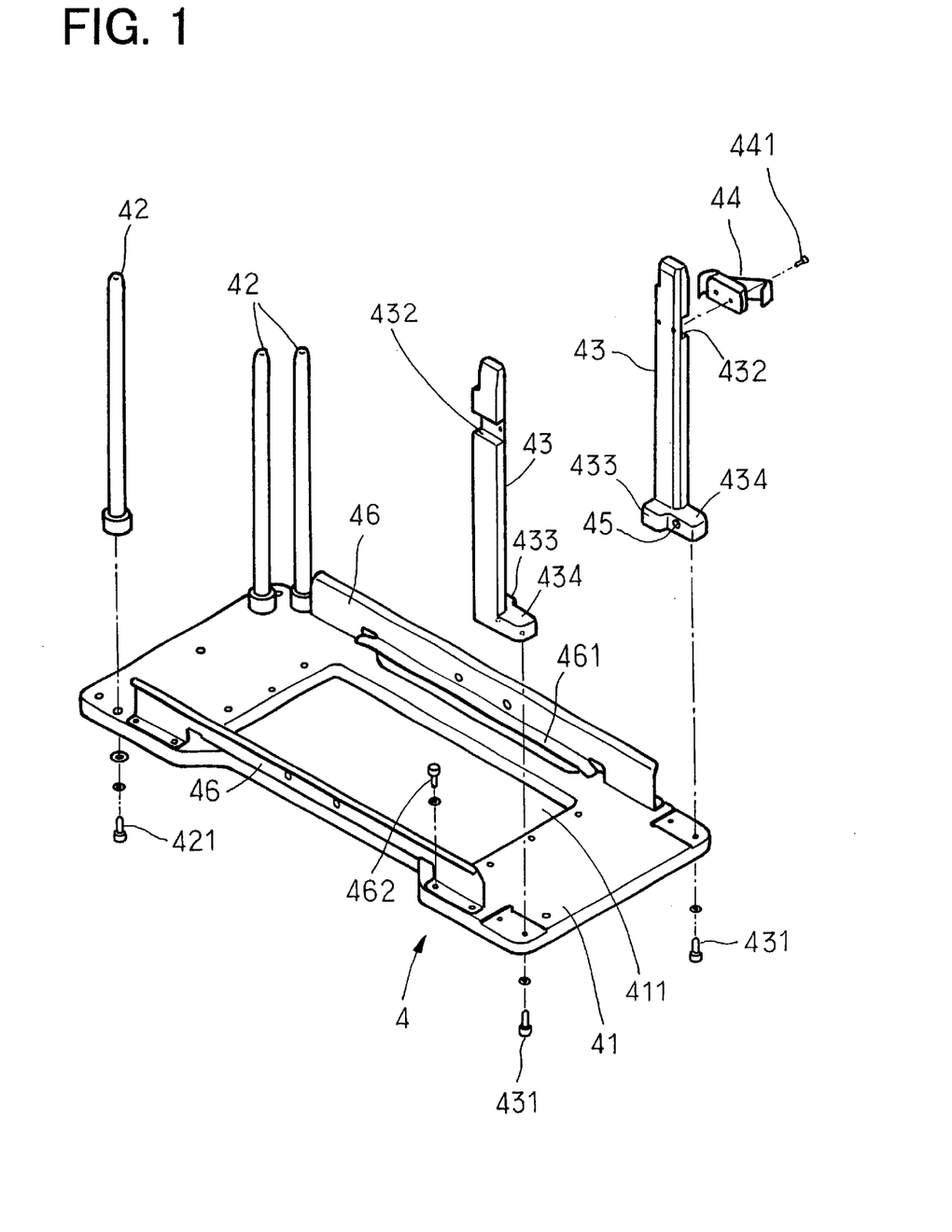
FIG. 1 is an exploded perspective view illustrating the construction of an embodiment of the customer tray storing apparatus according to the present invention with the pivotable door removed.
Figure 2:
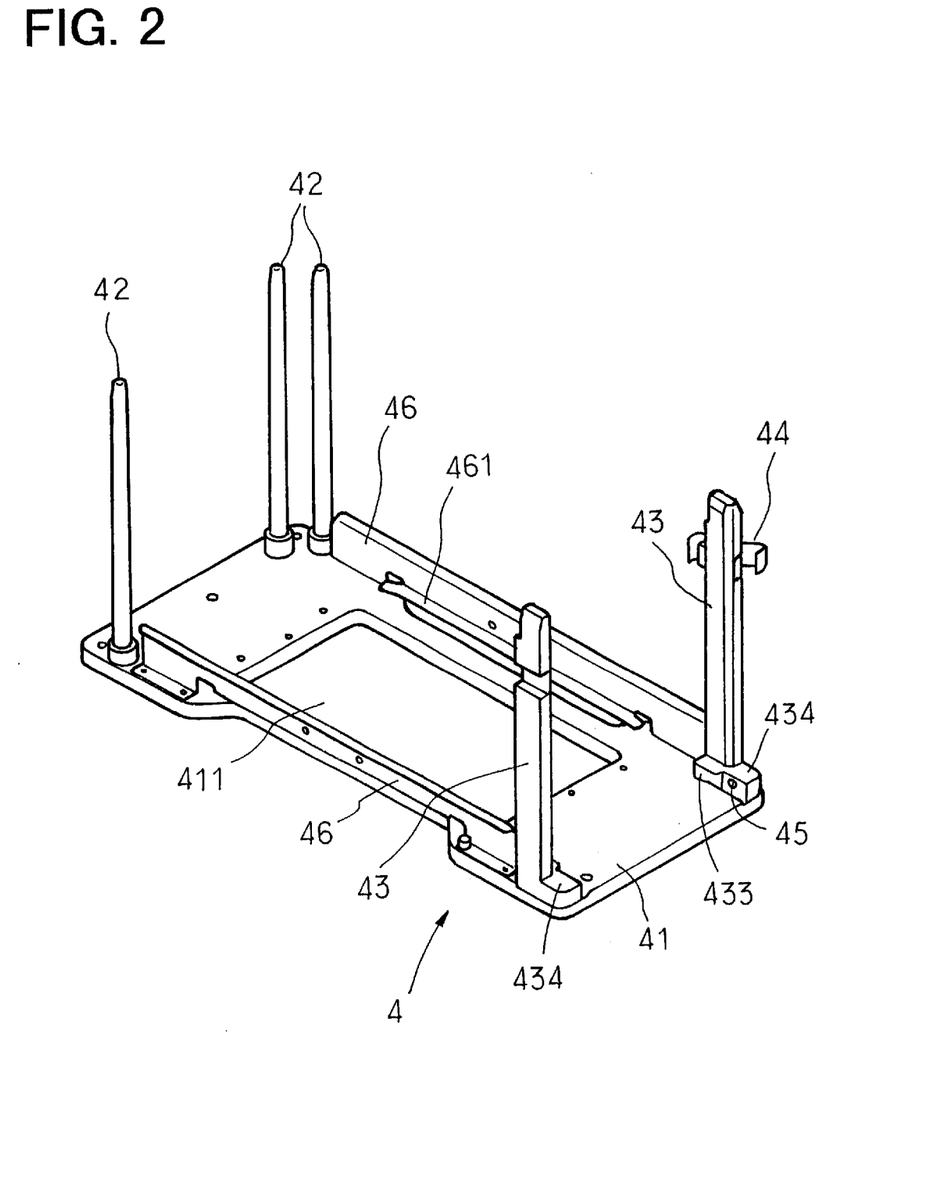
FIG. 2 is a perspective view illustrating the parts shown as broken down in FIG. 1 being assembled together.

FIG. 1 is an exploded perspective view illustrating an embodiment of the customer tray storing apparatus (which will be referred to as customer tray stocker hereinafter) according to the present invention with the pivotable door removed and one guide pin and a pair of door posts being illustrated as dismantled from the bottom frame. FIG. 2 is a perspective view illustrating the parts which have been disassembled in FIG. 1, that is, one guide pin and a pair of door posts being assembled to the bottom frame. It is to be noted here that in FIGS. 1 and 2 those parts and members corresponding to those in FIG. 7 are indicated by the same reference numerals or characters and will not be discussed again in detail unless required.

Since the customer tray stockers used in the handler as described previously with reference to FIG. 6 are all of identical construction, the IC-to-be-tested customer tray stocker 4 is representatively illustrated in FIGS. 1 and 2. Like the example of the conventional customer tray stocker shown in FIG. 7, this customer tray stocker 4 includes a bottom frame 41 generally rectangular in plan view and having a rectangular opening 411 in the center thereof for passage of an elevator therethrough.

In this embodiment, guide pins 42 are firmly secured to the bottom frame 41 adjacent each of the opposite ends of one of the minor sides of the frame and extend upwardly therefrom perpendicularly to the plane of bottom frame 41 while firmly secured to the bottom frame 41 adjacent the opposite ends of the other minor side of the bottom frame 41 are a pair of door posts 43 extending upwardly from the bottom frame 41 perpendicularly to the frame plane.

Three guide pins 42 in total are attached to the bottom frame 41 one adjacent one of the opposite ends of one of the minor sides of the bottom frame 41, one adjacent one of the opposite ends of one of the major sides, the one end of the one major side adjoining the one end of the one minor side, and one adjacent one of the opposite ends of the other major side, the one end of the other major side adjoining the other end of the one minor side. Each of the guide pins 42 is firmly secured to the bottom frame 41 by passing a bolt 421 through an associated through-aperture in the bottom frame 41 from therebelow into threaded engagement with axial screw threads formed in the bottom end of the guide pin. It is thus to be noted that there are no guide pins 42 attached to the bottom frame 41 adjacent the other end of the one minor side and adjacent the opposite ends of the other minor side, and that the two guide pins 42 attached to the bottom frame 41 adjacent the one ends of the two major sides of the bottom frame are in opposition to each other in the direction along the minor side.

The pair of door posts 43, 43 attached to the bottom frame 41 adjacent the opposite ends of the other minor side of the bottom frame act as guides corresponding to the guide pins 42 and are firmly secured to the bottom frame 41 by passing bolts 431 through associated through-apertures in the bottom frame 41 from therebelow into threaded engagement with axial screw threads formed in the bottom ends of the door posts 43, 43. Each of the door posts 43 has formed adjacent its top end a hook seating recess 432 in which a hook 44 is fitted and fixed to the door post 43 by a screw 441. It is to be understood that while the hook 44 is shown as fitted in the seating recess 432 of only one of the door posts 43, a similar hook 44 is also fitted in the seating recess 432 of the other door post.

The pair of door posts 43, 43 each have a generally L-shaped guide and support portion formed integrally therewith at its lower end, the guide and support portion comprising a first protrusion 433 projecting inwardly from the inner side surface of the post and having approximately the same width as that of the inner side surface and a second protrusion 434 projecting forwardly from the front side surface of the post and having a wider width than that of the front side surface of the post. The top surfaces of the two protrusions 433, 434 are flush with each other. The forwardly projecting protrusion 434 is broader than the front side surface of the door post 43 by the extent of projection inward beyond the front side surface of the post. Each of the forwardly projecting protrusions 434 is formed in its inner side surface with a cylindrical bearing 45 in which there is rotatably or pivotally journaled a pivot shaft 612 attached to a reinforcing beam 61 (see FIGS. 3 and 4) as will be described hereinafter.

The spacing between the inner side surfaces of the pair of door posts 43 is selected to be equal to or slightly greater than the length of the minor side of the customer tray 13, and the surfaces of the inwardly projecting protrusion 433 and the inwardly extending portion of the forwardly projecting protrusion 434 of the L-shaped guide and support portion act as guide surfaces to guide the bottom surface of the customer tray 13 along the opposite major sides thereof, as will be apparent later.

Further, a pair of opposed guide rails 46, 46 are attached to the top surface of the bottom frame 41 one along each of the opposite major sides thereof. Each of the guide rails 46 includes a guide ledge 461 which is defined by folding the lower middle portion intermediate the opposite ends thereof inwardly at about 90° for a certain length. The top surfaces of the guide ledges 461 act as guide surface to guide the bottom surface of the customer tray 13 along the opposite major sides thereof, and have their opposite end portions mildly bent downwardly to facilitate the introduction of customer tray 13 in the horizontal direction. Each of the guide rails 46 has mounting flanges extending substantially perpendicularly therefrom adjacent its opposite ends and is rigidly fixed to the bottom frame 41 by bolts 462 passed through the mounting flanges from above and threaded into the bottom frame 41.

In the customer tray stocker 4 constructed as described above, the points of attachment of and the spacing between the guide pin 42 attached adjacent the one end of the one minor side of the bottom frame 41 and the associated adjacent guide pin 42 attached adjacent the one end of the one major side thereof are determined such that one corner of a customer tray 13 may enter into the gap between the paired guide pins 42. It is also to be noted that the guide pins along the opposite major sides are located at opposed positions. It will thus be appreciated that when a customer tray 13, with one of the minor sides of the tray directed forward, is transported horizontally from the side of the door posts 43, 43 for storage into the stocker 4 of the construction described above, the customer tray 13 is prevented from further forward movement by one of the corners of the tray entering into the gap between the paired guide pins 42. The lateral movement of the customer tray toward either of the opposite major sides of the bottom frame 41 is prevented by the guide rails 46 mounted to the bottom frame 41 along its major sides while the rearward movement of the tray is prevented by a door 6 (see FIGS. 3 to 5) as will be described hereinafter. It is thus to be appreciated that customer trays 13 may be stored in a stable condition in which they are restrained from movement in any direction as far as the horizontal plane is concerned.

Figure 3:
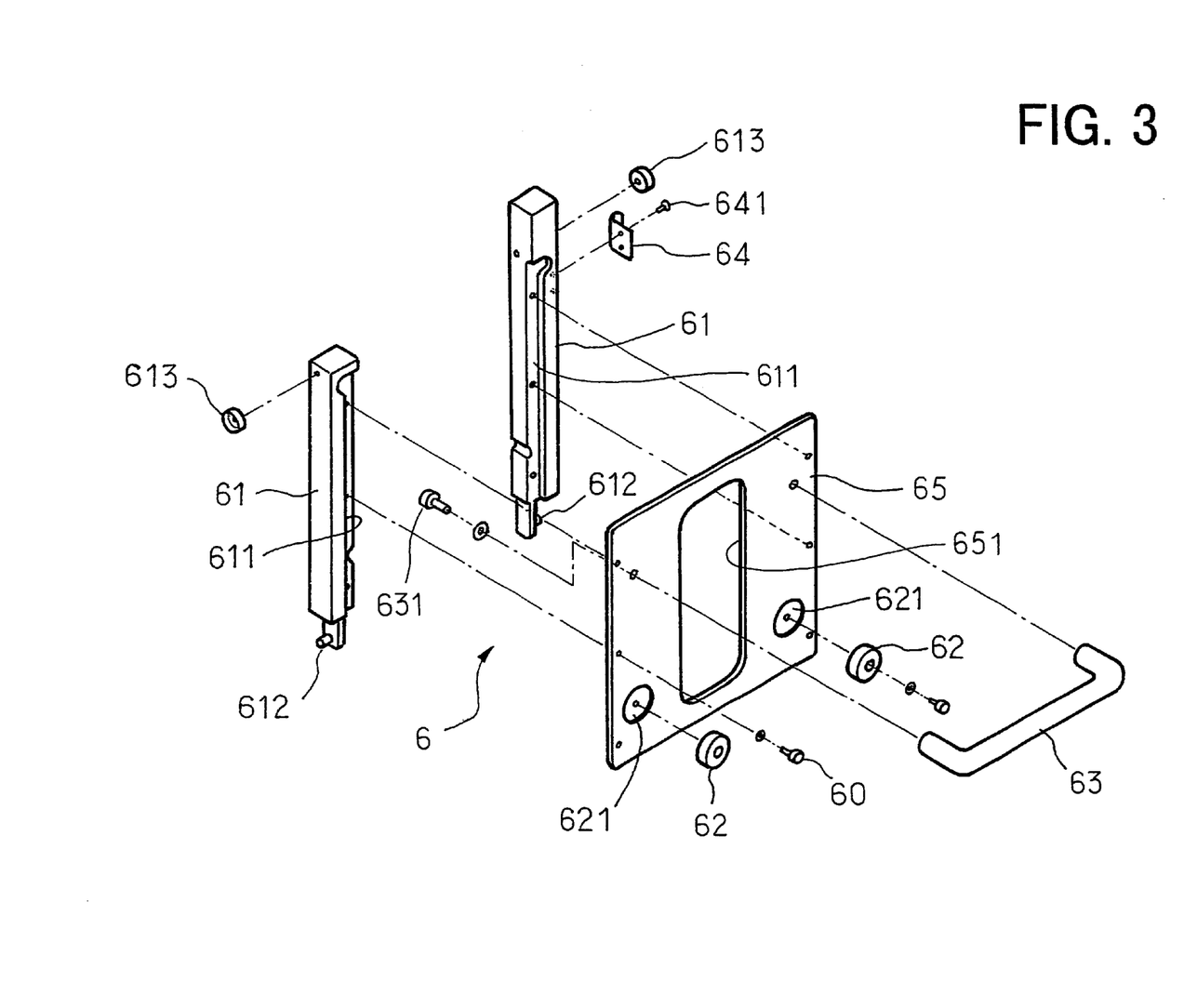
FIG. 3 is an exploded perspective view illustrating the pivotable door of the customer tray storing apparatus shown in FIG. 1.
Figure 4:
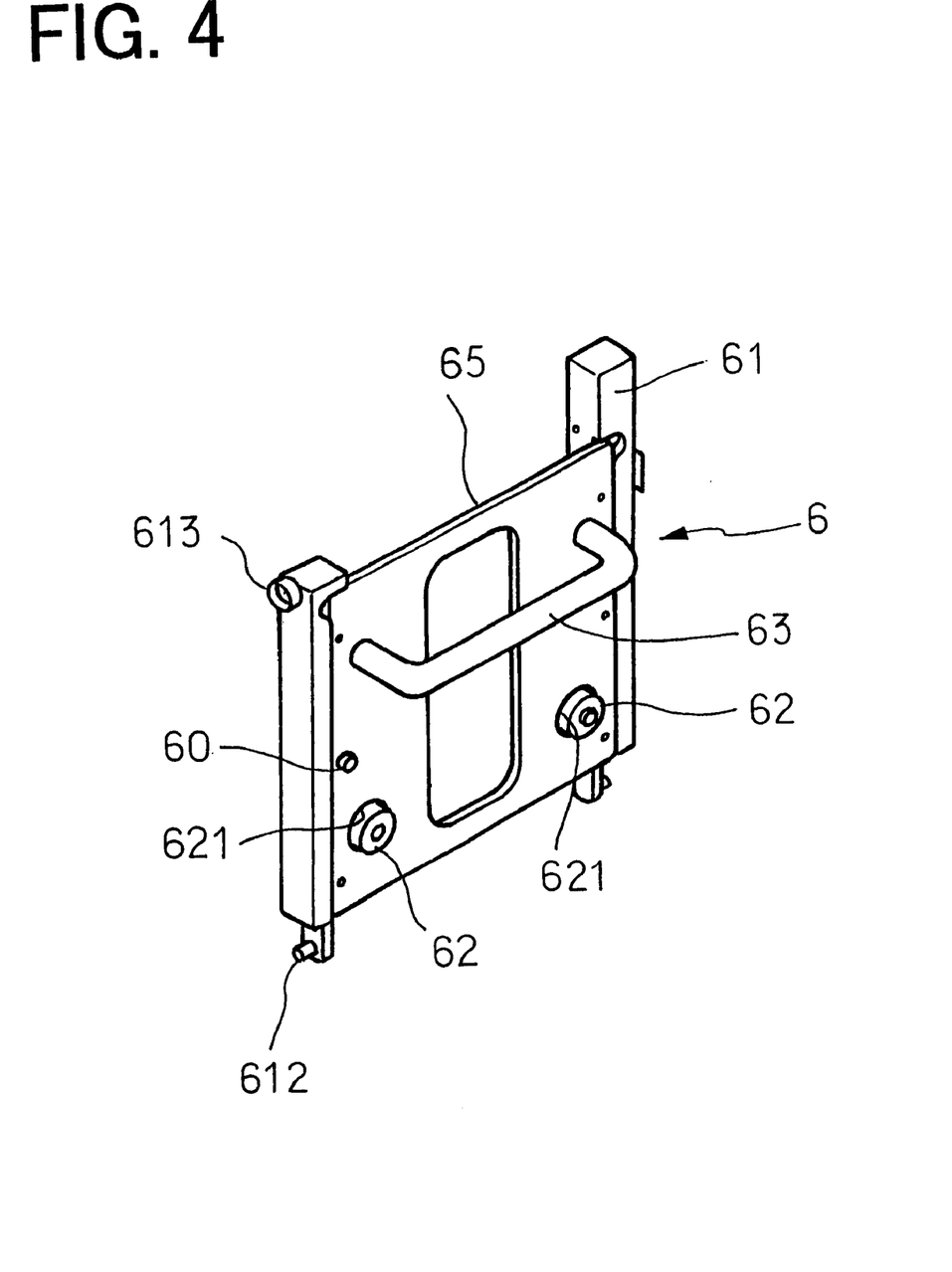
FIG. 4 is a perspective view illustrating the parts shown as broken down in FIG. 3 being assembled together.

Now, the door pivotally connected to the pair of door posts 43, 43 of the stocker 4 shown in FIGS. 1 and 2 will be described with reference to FIGS. 3 and 4. The door 6 comprises a pair of reinforcing beams 61, 61, a door member 65 fixed to the reinforcing beams 61, 61, and a handle 63 affixed to the front face of the door member 65 adjacent the upper end thereof. The door member 65 is a generally square plate member having a vertically elongated, generally rectangular opening 651 formed in the center thereof. Further formed in the front face of the door member 65 adjacent the lower end thereof toward the left-hand and right-hand sides are a pair of opposed circular holes 621 in each of which a limit stop 62 formed of resilient material such as urethane rubber is press fitted. These limit stops 62 serve as a cushion for the door 6 when it is pivoted open about 90° toward the front and held in its horizontal orientation, as will be explained later. It is to be understood that the door member 65 may be a rectangular plate member.

The pair of reinforcing beams 61, 61 each have a door mounting groove 611 formed longitudinally in the front side surface thereof. The door member 65 has its left-hand and right-hand side edges fitted in the corresponding door mounting groove 611 of the reinforcing beams 61 and is rigidly secured to the beams by fastening screws 60. The door member 65 is configured to be mechanically reinforced against deformation by being fixed to these reinforcing beams 61.

Each of the reinforcing beams 61 has an integral extension depending from its lower end and having a pivot shaft 612 projecting horizontally outwardly from the extension. In addition, a closing limit stop 613 formed of resilient material such as urethane rubber is fixed to the outer side surface of each of the reinforcing beams 61 adjacent the top end thereof by a screw, not shown. These closing limit stops 613 perform a cushioning function by abutting against the front side surfaces of the pair of door posts 43 when the door 6 is closed. Accordingly, the spacing between the pair of reinforcing beams 61 is selected such that the outer side surfaces of the beams 61 are positioned inward of the outer side surfaces of the door posts 43 when the door 6 is closed.

Further, the points of attachment of the stops 613 to the reinforcing beams 61 are selected such that those stops will be slightly deformed upon abutting against the front side surfaces of the door posts 43 when the door 6 is closed.

In addition, a catch member 64 is fastened by a fastening screw 641 to the outer side surface of the reinforcing beam 61 adjacent the top end thereof below the closing limit stop 613 in this example. While the catch member 64 is shown as attached to only one of the reinforcing beams 61, such catch members 64 are actually attached to both of the reinforcing beams. When the door 6 is closed, these catch members 64 come into engagement with the hooks 44 fixed to the outer side surface of the door posts 43 to maintain the door 6 in its closed position. While it is possible to maintain the door 6 closed with a single catch member 64 attached to only one of the reinforcing beams 61 and a single hook 44 fixed to the corresponding one of the door posts 43, it is preferred that such catch members 64 be attached to both of the reinforcing beams and that such hooks 44 be fixed to both of the door posts 43, because enhanced stability is obtained.

A handle 63 is fastened by fastening screws 631 to the front surface of the door member 65 adjacent the top end thereof. This handle 63 facilitates the operation of opening and closing the door 6, and also functions as a foot against a support surface for supporting the door 6 when the latter is swung open to the substantially horizontal position as will be described hereinafter.

Figure 1A:
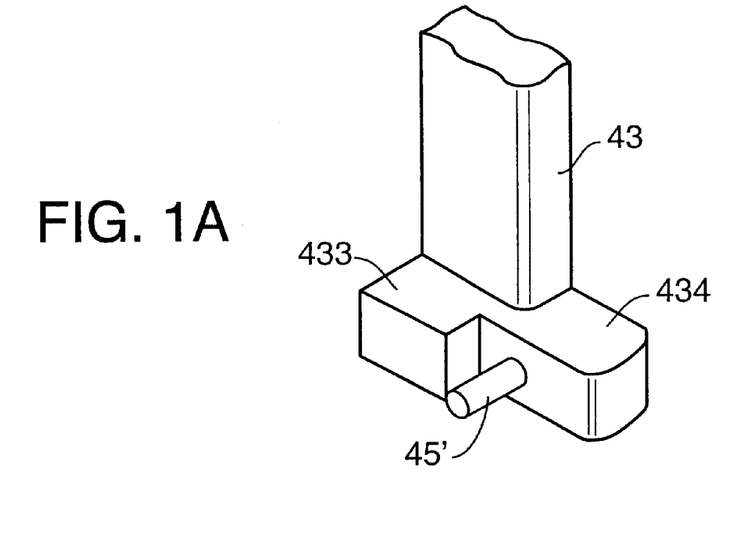
FIG. 1A is a perspective view of an alternative embodiment of the lower portion of the door posts shown in FIG. 1.
Figure 3A:
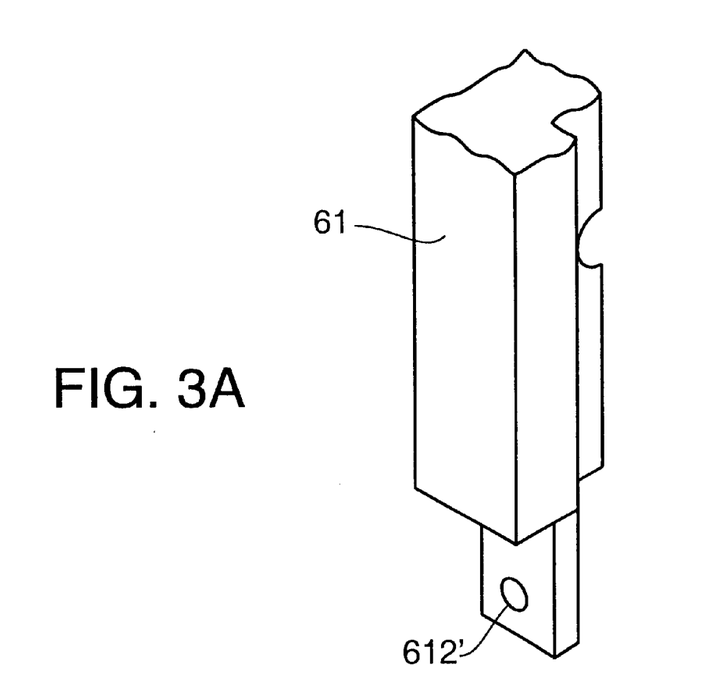
FIG. 3A is a perspective view of an alternative embodiment of the reinforcing beams shown in FIG. 3.

Once the door 6 constructed as described above has been assembled as shown in FIG. 4, it is pivotally mounted to the bottom frame 41 by fixing the door posts 43 to the bottom frame 41 as shown in FIG. 2 with the pivot shafts 612 disposed at the lower ends of the pair of reinforcing beams 61 fitted in the bearings 45 formed in the protrusions 434 at the lower ends of the pair of door posts 43 shown in FIG. 1. As an alternative modification, the door 6 is pivotally mounted to the bottom frame 41 by fitting pivot shafts 45' disposed at the protrusions 434 at the lower ends of the pair of door posts 43 as shown in FIG. 1A in bearings 612' formed at the lower ends of the pair of reinforcing beams 61 as shown in FIG. 3A. The customer tray equipped with a pivotable door according to the present invention is thus provided.

In addition to the stops 62 formed of resilient material, a torsion spring, although not shown in the drawings, may be interposed between the door posts 43 and the reinforcing beams 61 of the door 6 to enhance the cushioning action against the support surface for the door 6 when the latter is pivoted open to the substantially horizontal position. With such arrangement, it is possible to rotate the door 6 slowly whereby the shock which may otherwise occur upon the handle 63 abutting against the support surface may be reduced to virtually zero.

An instance will be explained with reference to FIG. 5 in which the customer tray stocker constructed as described above is used as a customer tray stocker 4 for storing customer trays in a stack each of which has been loaded with ICs to be tested in the loader section 11 of the handler shown in FIG. 6.

First, the engagement between the hooks 44 of the pair of door posts 43 and the catches 64 of the reinforcing beams 61 of the door 6 is released to rotate the door 6 by pulling the handle 63 toward the front (toward the operator). While the door 6 increases its rotational speed and angular moment by its own weight, the shock occurring upon the door 6 abutting against the support surface may be substantially reduced because the stops 62 in this example come into abutment with support members (not shown) upstanding from the support surface just before the handle 63 of the door 6 impacts on the support surface. In this regard, however, it is to be understood that it is possible to support the door 6 in the horizontal position on the support surface lying in the same plane without subjecting it to virtually any shock if the projecting height of the stops 62 is made slightly greater than that of the handle 63.

Interposing a torsion spring between the reinforcing beams 61 of the door 6 and the door posts 43 as required may reduce the shock occurring upon the door 6 abutting against the support surface to virtually zero. As a result, the door 6 is pivoted through about 90° toward the front without experiencing shock and held at the substantially horizontal position shown in FIG. 5.

Then, a stack of customer trays 13 each loaded with ICs to be tested comprising a predetermined number of trays stacked one on another is placed on the back surface of the door 6 in the substantially horizontal position such that the stack spans or straddles the back side surfaces of the opposed reinforcing beams 61. More specifically, the bottom surfaces of the opposite longitudinal side edges of the lowermost customer tray of the stack is rested on the inner side portions of the back surfaces of the opposed reinforcing beams 61. Since this job requires only placing a stack of customer trays on the door 6 at rest in its horizontal position, it will be appreciated that even if the weight of the stack is substantial as stated above, the job is considerably easy as compared to the conventional work involving grasping and lowering the stack of customer trays from above the stocker by hand while guiding the stack along the guide pins 42.

The next step is to push the stack of customer trays rested on the back surface of the door 6 horizontally toward the customer tray stocker 4, whereby the stack of customer trays slides on the opposed reinforcing beams 61, continuing to slide on the surfaces of the inwardly extending portions of the forwardly projecting protrusions 434 and of the inwardly projecting protrusions 433 of the L-shaped guide and support portion at the lower ends of the pair of door posts 43, and then on the guide ledges 461 of the pair of guide rails 46 to be stored on the bottom frame 41 of the stocker 4.

This pushing movement of the stack of customer trays in the horizontal direction is limited by one corner at the leading forward end of the stack entering into the gap between the pair of guide pins 42 fixed to the bottom frame 41. The lateral movement of the stack of customer trays toward either of the opposite major sides of the bottom frame 41 is prevented by the guide rails 46 mounted to the bottom frame 41 along its major sides. In this state, the door 6 is pivoted back to its closed position, whereafter the catches 64 of the reinforcing beams 61 are engaged with the hooks 44 of the door posts 43. With the door 6 closed, the back side surfaces of the reinforcing beams 61 of the door 6 extend inwardly beyond the front side surfaces of the door posts 43, so that any rearward movement (in the direction opposite from the pushing direction) of the stack of customer trays will bring the two corners at the rearward end of the stack into abutment against the back side surfaces of the reinforcing beams 61 of the door 6 to block the rearward movement. Accordingly, the rearward movement of the stack of customer trays is also prevented by the back side surfaces of the reinforcing beams 61. It is thus to be appreciated that customer trays 13 may be stored in the stocker 4 in a stable condition in which they are restrained from movement in any direction as far as the horizontal plane is concerned.

Besides, the operation of storing a stack of customer trays into the stocker 4 by pushing may be made quite easy if the leading forward end of the stack of customer trays is inserted between the pair of door posts 43 when resting the stack of customer trays on the door 6 straddling the back side surfaces of the opposed reinforcing beams 61 of the door. Alternatively, those portions of the back side surfaces of the opposed reinforcing beams 61 of the door 6 which are situated outside of the customer tray, that is, are not occupied by the stack placed thereon may be protruded to form longitudinal ridge sections so that longitudinally extending grooves are formed in the back side surfaces of the opposed reinforcing beams 61 of the door 6 for receiving the opposite longitudinal side edges of the stack of customer trays so as to guide the stack more stably, whereby the operation of storing a stack of customer trays into the stocker 4 by pushing may be further facilitated.

In addition, it is preferable that the pair of reinforcing beams 61 of the door 6 be supported by the support surface so as to adequately bear the load when a stack of customer trays is placed on the beams. In this regard, if the reinforcing beams 61 are supported in such a manner that the sections of the beams toward the front (the upper end portions of the beams 61 in FIG. 4) are somewhat higher than the sections toward the back (the lower end portions of the beams 61 in FIG. 4) to define a rearwardly downwardly inclined surfaces, the movement of a stack of customer trays into the stocker 4 may be further facilitated.

On the other hand, concerning the vertical movement of the stack of customer trays once stored in the customer tray stocker 4, no difficulties are encountered in the operation of moving the stack of customer trays up and down vertically by means of an elevator, not shown, through the opening 411 since the stack is stably guided by the three guide pins 42, the pair of door posts 43 and the back side surfaces of the reinforcing beams 61 of the door 6. It is of course to be understood that the customer tray stocker according to the present invention may also be used as it is when it is desired to store and/or remove customer trays from the top of the stocker like the conventional customer tray stocker.

While the foregoing has discussed the job and operation involved in the instance where the customer tray stocker is utilized as a stocker for storing customer trays in the form of a stack each of which has been loaded with ICs to be tested in the loader section 11 of the handler, it will be appreciated that when the customer tray stocker is used as a stocker for storing empty customer trays, the stack of customer trays may again be transported horizontally for storage into the stocker by the similar procedures.

Figure 5:
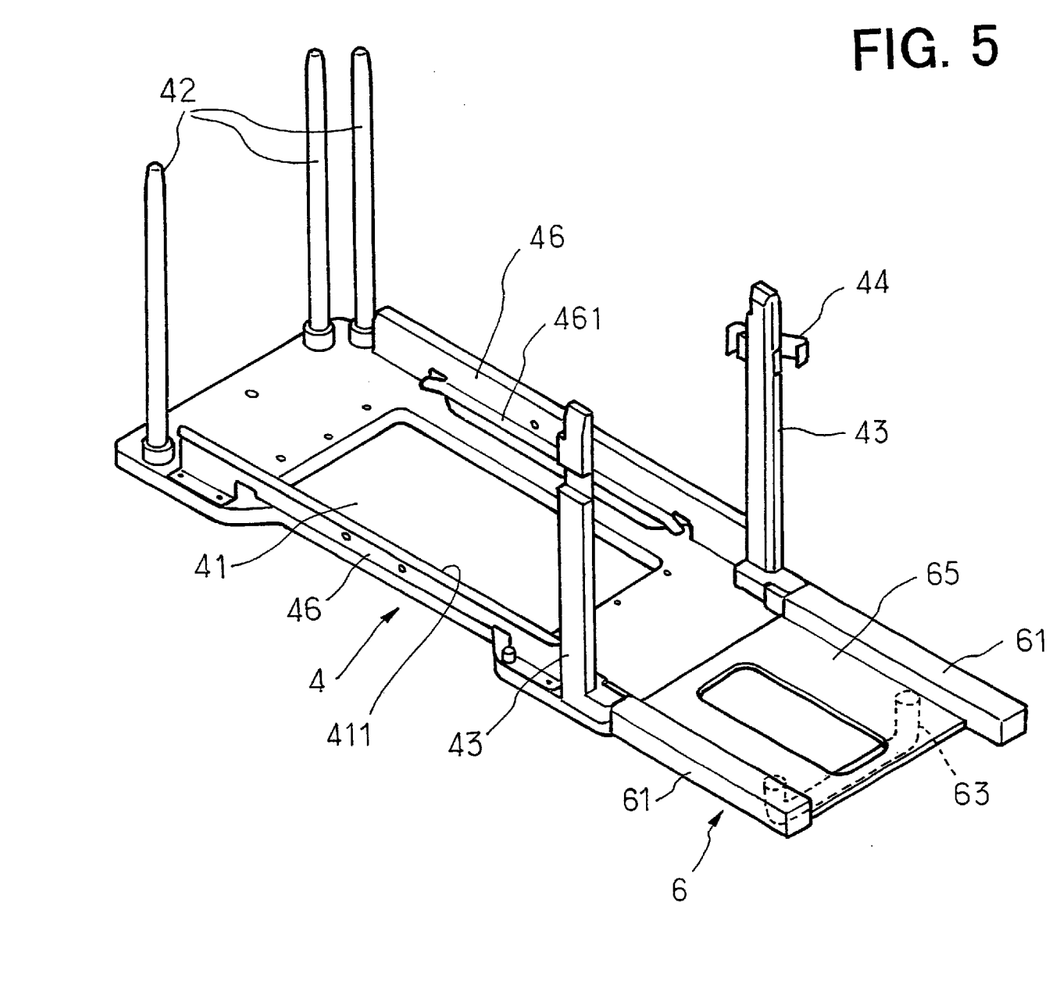
FIG. 5 is a perspective view illustrating one example of how to use an embodiment of the customer tray storing apparatus according to the present invention.

In the case that the stocker according to the present invention is used as a stocker to store a stack of customer trays each loaded with ICs tested and sorted out in the unloader section 12, once the stocker has been filled or once the test on all of the ICs has been completed, the engagement between the hooks 44 of the pair of door posts 43 and the catches 64 of the reinforcing beams 61 of the door 6 is released, followed by rotating the door 6 and holding it in the substantially horizontal position shown in FIG. 5 by pulling the handle 63 toward the front (the operators side). Then, the operator pushes the stack of customer trays stored in the stocker from the side opposite to the door 6 to move it out of the stocker onto the back side surface of the door 6 in its substantially horizontal position, and stop the stack as it straddles the back side surfaces of the opposed reinforcing beams 61 of the door.

Since this operation requires only moving a stack of customer trays horizontally onto the door 6 at rest in its horizontal position, it will be apparent that even if the weight of the stack is substantial as indicated above, the job is significantly easy as compared to the conventional work involving grasping and lifting the stack of customer trays to above the stocker by hand while guiding the stack along the guide pins 42 prior to removing the stack.

As is apparent from the foregoing disclosure, the present invention provides for storing customer trays or a stack of customer trays in a stocker by moving them in the horizontal direction as well as removing them from the stocker by moving them in the horizontal direction, without the need for making design changes to the handler per se. It is thus to be appreciated that the present invention provides the marked advantage of greatly facilitating the operation of storing and removing customer trays.

In addition, it will be understood that the capability of storing and removing customer trays or a stack of customer trays in and out of a stocker by moving them in the horizontal direction makes it possible to automate these jobs and operations, whereby ultimately the present invention may provide a handler and hence an IC testing apparatus in which automation extends up to the operations of storing and removing customer trays in and out of a stocker.

On top of that, the present invention would hardly pose any problems in terms of the initial cost since it requires that only minor design changes be made to the conventional customer tray stocker. Besides, addition of a lid to cover the top of the stocker would enable it to be utilized as a customer tray cassette when the operator or user carries customer trays.

While the present invention has been described with respect to the preferred embodiments illustrated herein, it will be apparent to those skilled in the art that various changes, alterations, modifications and minor improvements may be made to the embodiments described above without departing from the spirit and scope of the present invention. Accordingly, it should be understood that the present invention is not to be limited to the illustrated embodiments but encompasses all changes, alterations, modifications and minor improvements falling within the scope of the invention defined by the appended claims.

What is claimed is:

1. A customer tray storing apparatus comprising:
   a frame for resting thereon customer trays, said frame having a first side, a second side that is opposite said first side, a third side, and a fourth side that is opposite said third side;
   guide pins attached to said frame adjacent to opposite ends of said first side of the frame;
   a pair of door supports attached to said frame, a respective door support being adjacent to a respective end of said second side of the frame;
   a pair of guide members attached to said frame, one of said guide members being attached along said third side of the frame and another of said guide members being attached along said fourth side of the frame; and
   a door pivotally supported by said pair of door supports adjacent to their lower ends, wherein said door comprises a generally rectangular door member and a pair of reinforcing beams supporting said door member along opposite lateral side portions thereof, said reinforcing beams being provided at their lower ends with engagement portions pivotally engaged with corresponding engagement portions provided on said pair of door supports adjacent their lower ends.

2. The customer tray storing apparatus set forth in claim 1, wherein each of said pair of guide members is a rail in the form of an elongated plate having its lower middle portion folded inwardly at about a right angle.

3. The customer tray storing apparatus set forth in claim 1, wherein said engagement portions provided on said reinforcing beams at their lower ends are pivot shafts, and said engagement portions provided on said pair of door supports adjacent their lower ends are bearings for pivotally supporting corresponding pivot shafts.

4. The customer tray storing apparatus set forth in claim 3, wherein each of said door supports has a generally L-shaped guide and support portion formed integrally therewith at its lower end, said guide and support portion comprising a first protrusion projecting inwardly from an inner side surface of a corresponding door support and a second protrusion projecting forwardly from a front side surface of the corresponding door support such that top surfaces of the first and second protrusions are flush with each other, and said first protrusion projecting inwardly from the inner side surface of each of said door supports is formed in its inner side surface with a cylindrical bearing in which a corresponding one of said pivot shafts provided on said pair of reinforcing beams at their lower ends is pivotally fitted.

5. The customer tray storing apparatus set forth in claim 1, wherein said engagement portions provided on said reinforcing beams at their lower ends are bearings, and said engagement portions provided on said pair of door supports adjacent their lower ends are pivot shafts pivotally supported in corresponding bearings.

6. The customer tray storing apparatus set forth in any one of claims 1, 2, 3, or 5, wherein three said guide pins in total are attached to said frame so as to extend vertically from the frame, a first guide pin being positioned adjacent to an end of said first side of said frame, a second guide pin being positioned adjacent to an end of said third side that adjoins said first side, and a third guide pin being positioned adjacent to an end of said fourth side that adjoins said first side.

7. The customer tray storing apparatus set forth in claim 1, wherein a hook is attached to an outer side surface of each of said pair of door supports adjacent its upper end, and a catch member engageable with said hook is attached to an outer side surface of each of said pair of reinforcing beams adjacent its upper end.

8. The customer tray storing apparatus set forth in claim 1, wherein a handle is attached to a front face of said door member adjacent an upper end thereof.

9. The customer tray storing apparatus set forth in claim 1, wherein a cushioning stop formed of resilient material is fixed to a side surface of each of said reinforcing beams adjacent a top end thereof, and cushioning stop means formed of resilient material is attached to a front face of said door member adjacent a lower end thereof.

10. A customer tray storing apparatus comprising:
a frame for resting thereon customer trays, said frame having a first side, a second side that is opposite said first side, a third side, and a fourth side that is opposite said third side;
guide pins attached to said frame adjacent to opposite ends of said first side of the frame;
a pair of door supports attached to said frame, a respective door support being adjacent to a respective end of said second side of the frame, wherein each of said door supports has a generally L-shaped guide and support portion formed integrally therewith at its lower end, said guide and support portion comprising a first protrusion projecting inwardly from an inner side surface of a corresponding door support and a second protrusion projecting forwardly from a front side surface of the corresponding door support such that top surfaces of the first and second protrusions are flush with each other;
a pair of guide members attached to said frame, one of said guide members being attached along said third side of the frame and another of said guide members being attached along said fourth side of the frame; and
a door pivotally supported by said pair of door supports adjacent to their lower ends.

11. The customer tray storing apparatus set forth in claim 10, wherein each of said pair of guide members is a rail in the form of an elongated plate having its lower middle portion folded inwardly at about a right angle.

12. The customer tray storing apparatus set forth in claim 10, wherein said first protrusion projects inwardly by a first length from the inner side surface of the corresponding door supports and has a width approximately the same as that of the inner side surface of the corresponding door support, and said second protrusion has a width that is wider than that of the front side surface of the corresponding door support by an amount that is less than said first length.

13. The customer tray storing apparatus set forth in claim 10 or 12, wherein said first protrusion projecting inwardly from the inner side surface of each of said door supports is formed in its inner side surface with a cylindrical bearing for pivotally supporting said door.

14. A customer tray storing apparatus comprising:
a frame for resting thereon customer trays, said frame having a first side, a second side that is opposite said first side, a third side, one end of which adjoins one end of said first side, and a fourth side that is opposite said third side and one end of which adjoins the other end of said first side;
first, second, and third guide pins attached to said frame so as to extend vertically from the frame, said first guide pin being positioned adjacent to the one end of said first side of said frame, said second guide pin being positioned adjacent to the one end of said third side, and said third guide pin being positioned adjacent to the one end of said fourth side;
a pair of door supports attached to said frame at positions adjacent to respective other ends of said third and fourth sides of the frame;
a pair of guide members attached to said frame along said third and fourth sides of the frame; and
a door having a pair of reinforcing beams which are pivotally mounted at their lower end to said pair of door supports adjacent to their lower ends, respectively.

15. A customer tray storing apparatus comprising:
a frame for resting thereon customer trays to be stored, said frame having a first transverse side, a second transverse side which is opposite said first side, a third longitudinal sides one end of which is adjacent to one end of said first side, and a fourth longitudinal side which is opposite said third side and one end of which is adjacent to the other end of said first side;
at least first, second, and third guide pins attached to and extending vertically from said frame, said first guide pin being positioned adjacent to said one end of said first transverse side of the frame, said second guide pin being positioned adjacent to said one end of said third longitudinal side of the frame, and said third guide pin being positioned adjacent to said one end of said fourth longitudinal side of the frame;
a pair of door supports attached to and extending vertically from said frame, respective door supports being positioned adjacent to the other ends of said third and fourth longitudinal sides of the frame;

a pair of guide members attached to said frame along said third and fourth sides of the frame, respectively; and a door having a door member and a pair of reinforcing beams supporting said door member, wherein said pair of reinforcing beams of said door are pivotally mounted to said pair of door supports adjacent to their lower ends such that said door is pivotally movable about 90 degrees between a horizontal position and a vertical position, whereby when said door is in the vertical position, said pair of reinforcing beams are vertically extended at positions adjacent to the respective ends of said second transverse side of the frame.

16. The customer tray storing apparatus set forth in claim 15 further comprising a customer tray to be stored having a rectangular shape with a longitudinal length and a transverse length, wherein a spacing along the first transverse side of the frame between inner side surfaces of the second and third guide pins and a spacing along the second transverse side of the frame between inner side surfaces of the pair of door supports are equal to each other and are also equal to or larger than the transverse length of the customer tray to be stored, and a spacing along the third longitudinal side of the frame between an inner surface of the first guide pin and an inner surface of one of the reinforcing beams is equal to or larger than the longitudinal length of the customer tray, whereby the customer tray is stored on said frame by being guided by said three guide pins, pair of door supports, and pair of reinforcing beams while said door is in the vertical position.

17. The customer tray storing apparatus set forth in claim 16, wherein a spacing between inner surfaces of the reinforcing beams is smaller than the transverse length of the customer tray to be stored, whereby when said door is in the horizontal position, the custom tray is placed on the reinforcing beams and horizontally transported from outside onto said frame by passing through the spacing between the inner side surfaces of the pair of door supports.

* * * * *